United States Patent [19]

Wuyts

[11] Patent Number: 5,709,025
[45] Date of Patent: Jan. 20, 1998

[54] APPARATUS FOR WIRING A CONNECTOR

[75] Inventor: Robert Wuyts, Antwerpen, Belgium

[73] Assignee: Framatome Connectors International, Courbevoie, France

[21] Appl. No.: 635,894
[22] PCT Filed: Oct. 31, 1994
[86] PCT No.: PCT/EP94/03596
 § 371 Date: Jul. 19, 1996
 § 102(e) Date: Jul. 19, 1996
[87] PCT Pub. No.: WO95/12908
 PCT Pub. Date: May 11, 1995

[30] Foreign Application Priority Data

Nov. 5, 1993 [NL] Netherlands ............... 9301915
Aug. 8, 1994 [NL] Netherlands ............... 9401284

[51] Int. Cl.$^6$ ............................................ H01R 43/28
[52] U.S. Cl. .................... 29/748; 29/33 M; 29/721; 29/755; 29/760
[58] Field of Search ..................... 29/33 F, 33 M, 29/564.4, 748, 749, 755, 760, 721, 863, 866; 269/903

[56] References Cited

U.S. PATENT DOCUMENTS

| | | | |
|---|---|---|---|
| 4,441,251 | 4/1984 | Grubb | 29/866 X |
| 4,731,633 | 3/1988 | Kovalchick et al. | 358/721 |
| 4,967,470 | 11/1990 | Folk | 29/748 X |
| 5,485,660 | 1/1996 | Pittau | 29/721 X |
| 5,515,601 | 5/1996 | Maejima | 29/33 M X |

FOREIGN PATENT DOCUMENTS

| | | |
|---|---|---|
| 0 390 080 A1 | 10/1990 | European Pat. Off. . |
| 2 555 397 | 5/1985 | France . |
| 2842 342 B1 | 8/1979 | Germany . |
| 3440711 A1 | 5/1985 | Germany . |
| 3934401 A1 | 4/1991 | Germany . |
| 3216980 | 9/1991 | Japan ............... 29/748 |
| 3280376 | 12/1991 | Japan ............... 29/748 |
| 5166574 | 7/1993 | Japan ............... 29/755 |
| 5234659 | 9/1993 | Japan ............... 29/863 |
| 2039806 | 8/1980 | United Kingdom ............... 29/863 |

*Primary Examiner*—Peter Vo
*Attorney, Agent, or Firm*—Perman & Green, LLP

[57] ABSTRACT

An apparatus for wiring a connector (1), in particular a connector with a plurality of contacts (2) comprises an elongated holder (3) for the connector to be wired, the elongated holder being aligned with an axis in the x-direction, at each longitudinal side of the holder a tool (5) movable back and forth in any-direction transverse to the holder for applying a wire into a contact aligned with the tool, wherein a wire guiding means (6) is provided for the tool, the wire guiding means being aligned with the tool, and means for moving the tool with respect to the holder in the x-direction. Means (17-20) for supplying a wire (10) to a wire guiding means (6) is provided and comprises a gripper (17) and means (20) for moving the gripper in the x-, y- and z-directions and in that the wire selection means (11-16; 40) comprises a stationary wire selection plate (12) defined by a plane with an insertion opening (11) for a bundle of wires to be connected, the selection slot (13) being provided in the selection plate joining the insertion opening with its inlet and having its outlet in an edge of the wire selection plate lying opposite of the insertion opening (11), wherein a bundle of wires introduced in the insertion opening are permitted to enter the selection slot in a single row, each wire protruding transversely to the plane of the wire selection plate, wherein the wire selection means further comprises a separating means (15; 42–45) for separating the wire (46) adjacent to the shutter (14) from the remaining wires (1) in the selection slot.

13 Claims, 4 Drawing Sheets

APPARATUS FOR WIRING A CONNECTOR

The invention relates to an apparatus for wiring a connector according to the preamble of claim 1.

An apparatus of the above-mentioned type is for example disclosed in EP-A-0 390 080. For identifying a wire of a number of wires, for example, combined in a cable, the known apparatus requires that on the one hand each wire of the bundle must be connected to a connecting unit in a predetermined manner and a second physical electric contact must be made with each wire. Thereby, the known apparatus is rather complicated and the use of the apparatus is cumbersome.

The invention aims to provide an apparatus of the above-mentioned type which is made in a relatively simple manner and by means of which a connector can be wired with high speed.

To this end the apparatus according to the invention is characterized by the characterizing features of claim 1.

In this manner an apparatus is obtained by means of which a connector can be wired fully automatically in a very reliable manner and with a high speed.

Preferably, the apparatus is characterized by a colour camera for observing a separated wire, wherein the processing unit determines the colour code of the observed wire from the picture signal of the colour camera and retrieves the position of the corresponding contact in the connector to be wired from a table, whereafter the processing unit controls the shutter of the wire selection means for delivering the wire, controls the gripper moving means for feeding the delivered wire to the corresponding wire guiding means and controls the tool moving means for aligning the tool with the corresponding contact.

The invention will be further explained by reference to the drawings in which an embodiment of the apparatus according to the invention is schematically shown.

DETAILED DESCRIPTION OF THE PREFERRED EMBODIMENT

Figure 1:
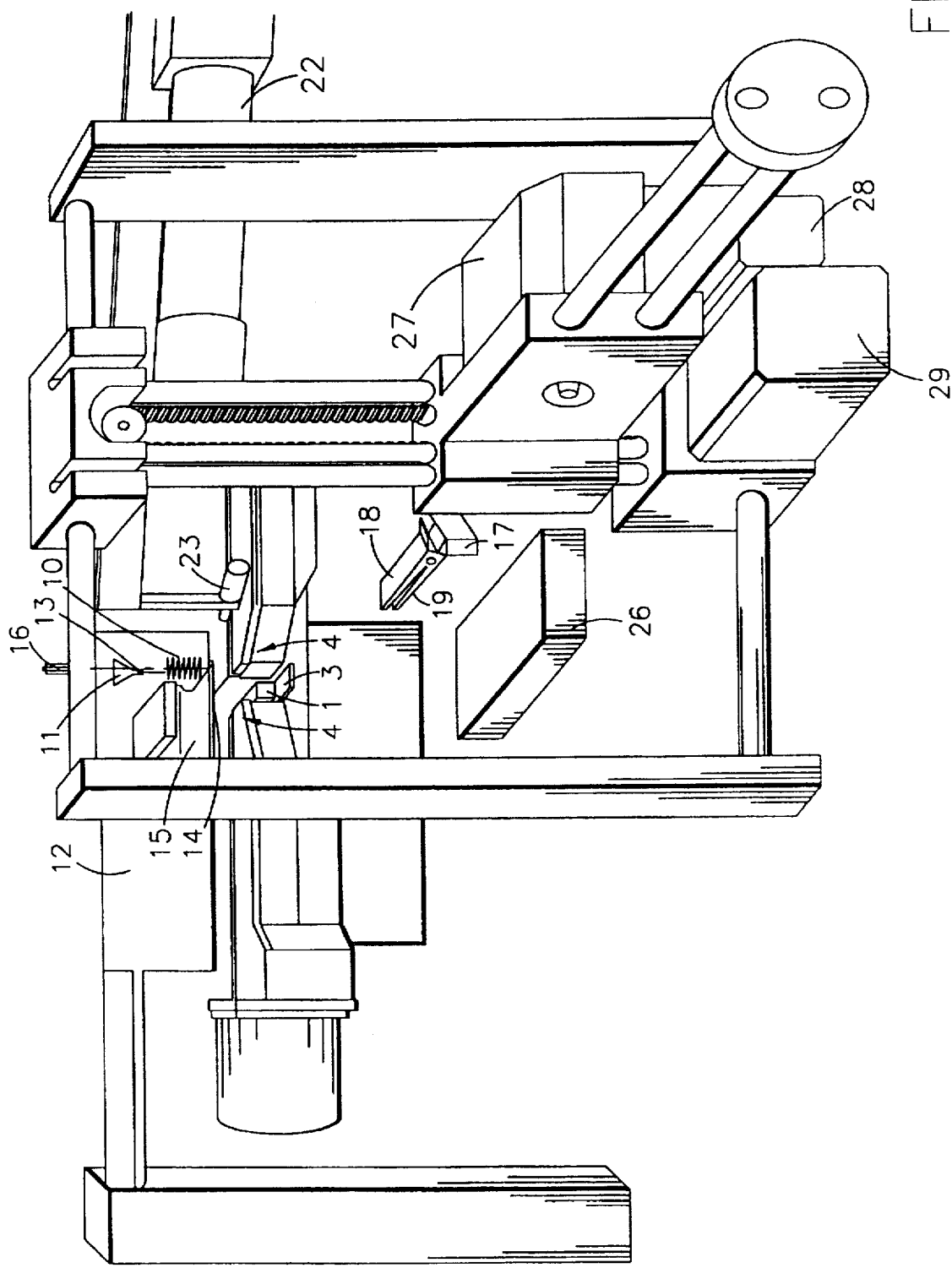
FIG. 1 shows schematically a perspective view of the main part of an embodiment of the apparatus according to the invention.
Figure 2:
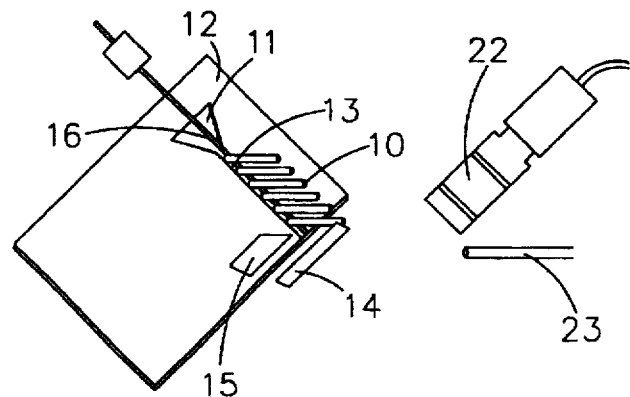
FIG. 2 shows a very schematical perspective view of some important/components of the apparatus of FIG. 1.
Figure 3:
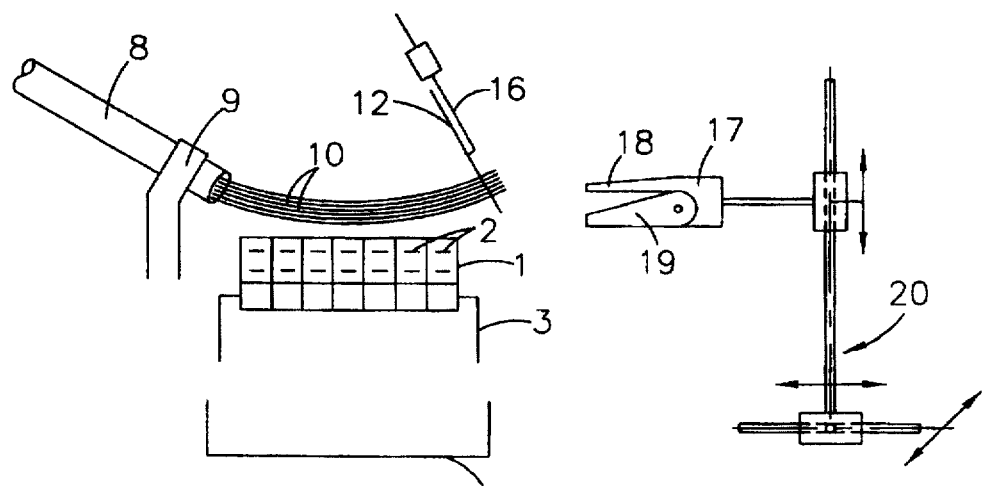
FIG. 3 shows very schematically a side view of the part
Figure 4:
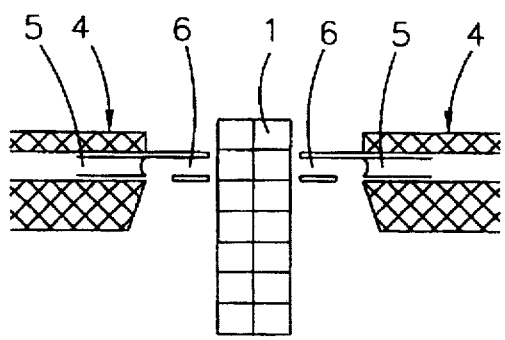
FIG. 4 shows very schematically a top view of a part of the apparat s of FIG. 1.

FIGS. 1–5 schematically show an apparatus for wiring a connector 1 having a plurality of contacts 2 of the IDC-type. FIG. 1 partially shows a perspective view of the main part of the apparatus and FIGS. 2–4 very schematically shows different views to further explain the basic elements of this apparatus.

The apparatus comprises a holder 3 in which the connector 1 to be wired is placed, wherein a wire insertion head 4 is located at each side of the holder 3, said wire insertion head having a tool 5 movable back and forth transverse to the longitudinal direction of the holder 3. Each wire insertion head 4 further comprises a wire guiding means 6 into which a wire to be connected to a contact 2, can be brought. The wire insertion heads 4 are movable in the longitudinal direction of the holder 3 by a driving means 7 indicated in the block diagram of FIG. 5, so that the tools 5 can be aligned with each contact 2 of the connector 1 located in the holder 3.

The apparatus further comprises wire selection means which are mounted in a predetermined fixed position. The wires are generally part of a cable 8 which is clamped in a cable clamp 9 schematically shown. The wires 10 are inserted into an insertion opening 11 of a stationary located wire selection plate 12 which is part of the wire selection means. A selection slot 13 is provided in the wire selection plate 12, said slot 13 joining the insertion opening 11 at one side and at the other side debouching with an outlet in an edge of the wire selection plate 12 lying below the insertion opening 11. The wires 10 inserted into the insertion opening 11 fall in a random order into the selection slot 13, the width of which corresponds with the diameter of the individual wires 10. The outlet of the selection slot 13 is closed by a shutter 14 which is operable in a manner not further shown for opening the outlet of the wire selection slot 13. Further, the wire selection means comprises a slide 15 with a wedge-shaped end, said slide being movable transverse to the selection slot 13 in a manner also not further shown. The wires 10 which fall into the selection slot 13 under influence of the gravity, are pressed downwards by a pressing member 16.

The apparatus is further provided with a gripper 17 with a fixed upper jaw part 18 and a movable lower jaw part 19. The gripper 17 is movable in the x-, y- and z-directions by means 20 schematically shown in FIG. 3. The gripper moving means 20 includes three motors 27, 28 and 29 shown in FIG. 1. By means of the motor 27 the gripper 17 can be moved towards the connector 1 and back. By means of the motor 28 and 29 the gripper can be moved to the left and right and up and down, respectively.

Figure 5:
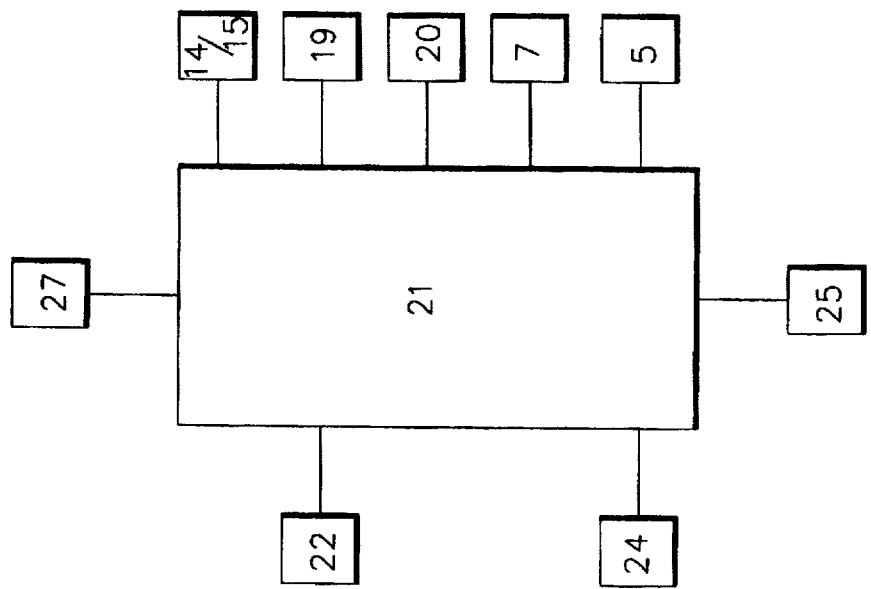
FIG. 5 is a block diagram of the apparatus of FIG. 1.
Figure 7:
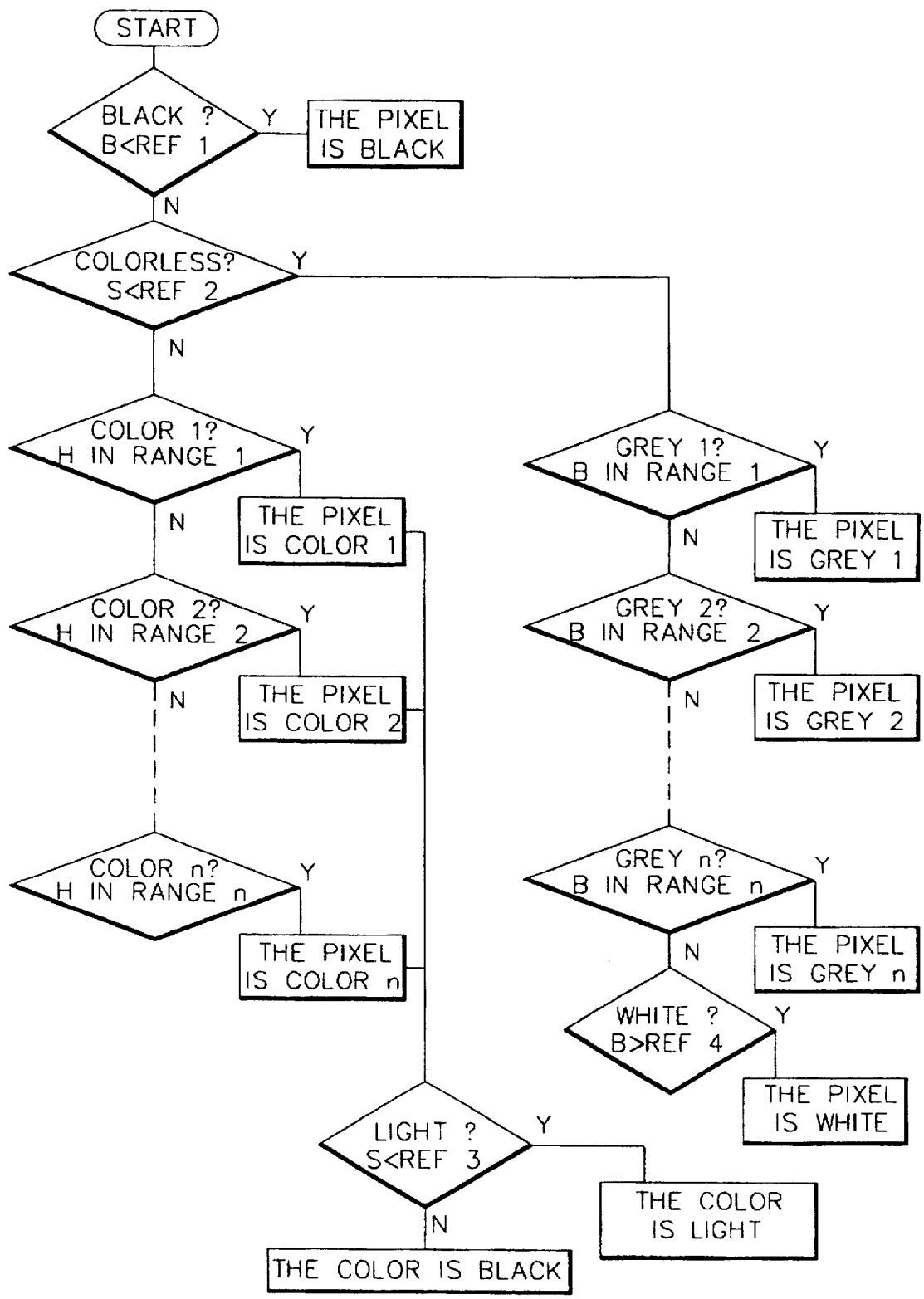
FIG. 7 shows a flow diagram for the explanation of the method used in the apparatus of FIG. 1.

Finally, the apparatus comprises a processing unit 21 schematically indicated in FIG. 5, said processing unit 21 being provided with high speed microprocessors. A colour camera 22 is connected to the processing unit 21, which camera 22 provides colour signals by means of which the processing unit can identify an observed wire. A light source 23 illuminates the wire adjacent the shutter 14, so that the colour camera 22 can observe a constantly illuminated picture. Wiring diagrams for various connectors can be stored in a memory 24, wherein, through a keyboard 25, the processing unit 21 can be set for wiring a certain connector and the processing unit will control the wiring process by means of the wiring diagram stored in the memory 24.

For wiring a connector 1, the connector is placed in the holder 3 and the wires 10 of the cable 8 are put through the insertion opening 11 of the wire selection plate 12. The wires 10 fall into the slot 13 wherein the lowermost wire will be lying on the shutter 14. Subsequently, the processing unit 21 actuates the slide 15 operating as a separator so that the wire 10 adjacent the shutter 14 will be separated from the remaining wires 10. The separated wire 10 is illuminated by the light source 23 and the colour camera 22 supplies picture signals to the processing unit 21. The processing unit 21 controls the gripper moving means 20, i.e. the motors 26, 27 and 28, and the movable jaw part 19 of the gripper 17 in such a manner that the separated wire is gripped and is held in a predetermined position, so that an unambiguous observation of each separated wire is possible.

The processing unit 21 determines the colour code of the observed wire 10 from the received picture signals of the colour camera 22. Normally, this colour code consists of a main colour wherein a second colour can be present or not in rings with a predetermined repetition frequency. It will be assumed hereinafter that this second colour is black. However, other colours are possible as second colour.

When the processing unit 21 has determined the colour code of the separated wire 10, the shutter 14 is opened, so that the separated wire is released. The remaining wires are held in the selection slot 13 by the slide 15. The processing unit 21 controls the gripper moving means 20 in such a manner that the gripper 17 moves the wire 10 towards the wire guiding means 6 lying at the side where the contact 2 to be wired of the connector 1 is located. Further, the processing unit 21 controls the driving means 7 of the wire insertion heads 4 in such a manner that the tools 5 are aligned with the contact 2 to be wired. The gripper 17 moves according to a spherical shell path, the centre of which is located substantially in the cable clamp 9. As soon as the wire 10 is in the respective wire guiding means 6, the gripper 17 moves according to a second spherical shell path with smaller radius and tightens the wire 10 in the wire guiding means 6. Thereafter, the processing unit 21 actuates the respective tool 5 and the wire 10 is cut in a usual manner at the correct length and is attached to the respective contact 2. The cut-off wire part is disposed in a scrap container 26 by the gripper 17.

Simultaneously with moving the released wire 10 to the wire guiding means 6, the processing unit 21 controls the shutter 14 for closing the selection slot 13 and the slide 15 is controlled for opening the selection slot 13. The wires 10 move downwardly in the selection slot 13, whereafter the slide 15 separates the remaining wires 10 again from the wire 10 adjacent the shutter 14. After the earlier released wire has been attached in the corresponding contact 2, a next wire can be identified and can be attached to the corresponding contact.

The processing unit 21 stores the already connected wires 10 of a connector 1 to be wired in the memory 24. During the wiring process the processing unit 21 can thereby compare each next separated wire 10 with the wires already connected to contacts 2. If a wire is identified which according to the information stored in the memory 24, is already connected to a contact 2, the processing unit makes a new identification at another location of the wire. When the processing unit 21 finds a colour code during a renewed identification which is contrary to the first identification, for example blue instead of red, the processing unit 21 provides an alarm signal and stops the wiring process of the connector 1. If after a predetermined plurality of identification attempts, for example five, no colour code of a wire 10 not yet connected is found, an alarm signal is also provided and the wiring process of the connector 1 is stopped.

The processing unit 21 shows the selected wiring diagram on a display 27, wherein during wiring also the progress of the wiring process and the obtained result can be shown.

Figure 6:
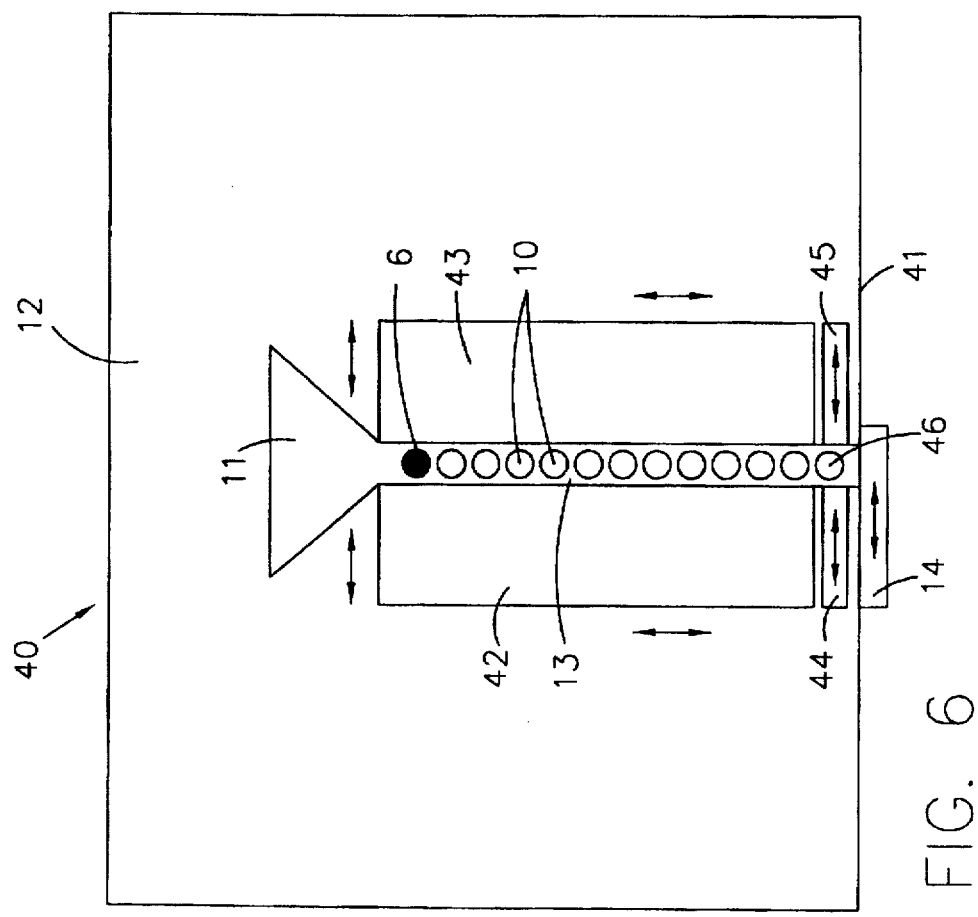
FIG. 6 is a front view of an alternative embodiment of the wire selection means for use in the apparatus of FIG. 1.

FIG. 6 shows a front view of an alternative embodiment of the wire selection means to be used in the apparatus of FIG. 1. The wire selection means are indicated in FIG. 6 by reference numeral 40 and comprises in the same manner as the wire selection means already described, a stationary wire selection plate 12 with an insertion opening 11 into which the wires 10 of the cable 8 can be put. FIG. 6, the wires 10 are already located in the selection slot 13 which on one side joins the insertion opening 11 and on the other side debouches with an outlet in an edge 41 of the wire selection plate 12. A pressing means 6 presses the wires 10 into the direction of the outlet of the selection slot 13.

The outlet of the selection slot 13 is closed by a shutter 14 which is movable back and forth as indicated by a double arrow. Therefore, the shutter 14 can open and close the outlet of the selection slot 13.

At both sides of the selection slot 13 a clamping jaw 42 or 43, respectively, is provided, said clamping jaws 42, 43 together forming a first clamping means.

The clamping jaws 42, 43 are movable back and forth transverse to the selection slot 13 and in the longitudinal direction of the selection slot 13, as is also indicated by double arrows. Further, a clamping means is provided having a clamping jaw 44 or 45, respectively, at each side of the selection slot 13. These clamping jaws 44, 45 are movable back and forth transverse to the selection slot 13 only and can clamp the wire 46 adjacent the shutter 14.

The wire selection means 40 operates as follows.

When the wires 10 are put into the insertion opening 11, the clamping jaws 42, 43, 44 and 45 are in the open position, so that the wires 10 fall into the selection slot 13 in a random order. Subsequently, the pressing member 6 is placed upon the upper wire 10. Thereafter, all clamping jaws 42, 43 and 44, 45 are closed, so that both the wire 46 adjacent the shutter 14 and the remaining wires 10 are clamped. Then the clamping jaws 42, 43 are moved upwardly so that the wires 10 are separated from the wire 46 adjacent the shutter 14. The thus selected wire can now be gripped by the gripper 17, whereafter the shutter 14 is opened just as the clamping jaws 44, 45, so that the gripper 17 is able to move the selected wire 46 into the connection position.

Thereafter, the shutter 14 closes the outlet of the selection slot 13 again and the clamping jaws 42, 43 are opened and moved downwardly. The wires 10 move downwardly so that a next wire will be adjacent the shutter 14 and the cycle can be repeated. The wire selection means 40 has the advantage that a slide for separating the wires 10 is not used, whereby damage to the wire insulation is avoided. Moreover, the wire selection means 40 can also be used for selecting twisted pair wires of a bundle.

It is noted that instead of the clamping jaws 44, 45 it is also possible to use other means for gripping the wire adjacent the shutter 14. For this purpose it would be possible, for example, to use the gripper 17 of the wiring apparatus itself.

The identification of the colour code by the processing unit 21 preferably takes place as follows:

The picture information obtained from the colour camera 22, is stored in the memory 24 by the processing unit 21. In a plurality of pixels distributed along the length of the observed wire, for example 15 pixels along a length of 7 mm, the hue, saturation and brightness values (H-, S- en B-values) are determined. To this end the processing unit 21 can be equipped with an integrated circuit which is known per se. The saturation value S provides an indication for the white portion. The more white light is mixed with the colour, the smaller the saturation value becomes. The brightness value B provides an indication for the light intensity, wherein a brightness value of zero corresponds with pure black. The hue value H corresponds with the position in the colour circle and is for example expressed in degrees.

As indicated in the flow diagram of FIG. 5, the brightness value is compared with a first reference value in a first step, wherein, if the brightness value B is smaller than the first reference value, it is assumed that the pixel is black. In a second step which of course is only made if the pixel is not black, the saturation value S is compared with a second reference value, wherein, if the value S is smaller than the second reference value, it is assumed that the pixel is colourless or grey or white. If the comparison of the saturation value S with the second reference value indicates that there is indeed a grey or colourless wire, the brightness B is successively compared with successive reference ranges to determine the grey level of the pixel or whether the pixel is white, as indicated in the flow diagram.

If the comparison of the saturation value S with the second reference value indicates that the pixel is not colourless, the hue value H is compared with a plurality of successive reference ranges each corresponding with a predetermined colour. When a certain colour is found, the saturation value is finally compared with a third reference value by means of which it is determined whether the colour found is light or dark.

When the colour is determined for all pixels, the colour which is the most detected one, is chosen as main colour for the observed wire. If a plurality of pixels higher than a predetermined plurality have a common second colour, it is assumed that there is a colour code with a second colour provided in rings.

The length of wire along which the pixels of which the colour is determined, are regularly distributed, is chosen at least equal to the repetition length of the rings of the second colour. The mutual distance between the pixels is chosen in such a manner that there are always at least three pixels in a ring of the second colour.

The invention is not restricted to the above-described embodiments which can be varied in a number of ways within the scope of the claims.

We claim:

1. Apparatus for wiring a connector (1), in particular a connector with a plurality of contacts (2), comprising an elongated holder (3) for the connector to be wired, said elongated holder being aligned with an axis in the x-direction, at each longitudinal side of the holder a tool (5) movable back and forth in an y-direction transverse to the holder for applying a wire into a contact aligned with the associated tool, wherein a wire guiding means (6) is provided for each tool, said wire guiding means being aligned with the corresponding tool, means for moving the tools with respect to the holder in the x-direction, wire selection means (11–16; 40) for separating and delivering the wires (10) to be connected one by one, means (17–20) for supplying a delivered wire to a wire guiding means (6) and a processing unit (21) identifying a separated wire and controlling the wire selection means, the wire supplying means, the tool moving means and operating the tools in dependence on the identified wire, wherein the wire selection means (11–16; 40) comprises a selection slot (13) with an inlet and an outlet, the width of said selection slot substantially corresponding with the diameter of the individual wires and a shutter (14) for closing and opening the outlet of the selection slot, wherein said means (17–20) for supplying a wire (10) to a wire guiding means (6) comprises a gripper (17) and means (20) for moving the gripper in the x-, y- and z-direction, said wire selection means (11–16; 40) comprises a stationary wire selection plate (12) defined by a plane with an insertion opening (11) for a bundle of wires to be connected, said selection slot (13) being provided in said selection plate joining the insertion opening with its inlet and having its outlet in an edge of the wire selection plate lying opposite of the insertion opening (11), wherein a bundle of wires introduced in the insertion opening are permitted to enter the selection slot in a single row, each wire protruding transversely to the plane of the wire selection plate, wherein the wire selection means further comprises a separating means (15; 42–45) for separating the wire (46) adjacent to the shutter (14) from the remaining wires (1) in the selection slot.

2. Apparatus according to claim 1, wherein the separating means comprises a slide (15) with a wedge-shaped end movable back and forth with respect to the selection slot (13).

3. Apparatus according to claim 1, wherein the separating means comprises a first clamping means (42, 43) for clamping said remaining wires in the selection slot (13).

4. Apparatus according to claim 3, wherein a second clamping means (44, 45) is provided for clamping the wire (46) adjacent to the shutter (14), wherein both said first and second clamping means (42–45) are movable back and forth with respect to each other.

5. Apparatus according to claim 4, wherein said first clamping means comprising two clamping jaws (42, 43) each lying at a longitudinal side of the selection slot (13), said clamping jaws being movable back and forth transverse to the selection slot and in the longitudinal direction of the selection slot.

6. Apparatus according to claim 5, wherein said second clamping means comprises two clamping jaws (44, 45) one at each longitudinal side of the selection slot (13), said clamping jaws being movable back and forth transverse to the selection slot.

7. Apparatus according to claim 1, wherein the wire selection means (11–16; 40) comprises a pressing member (16) for moving the wires in the selection slot (13) into the direction of the shutter (14).

8. Apparatus according to claim 7, wherein the processing unit (21) controlling the wire selection means (11–16; 40) for separating a next wire during the process of supplying the delivered wire by the gripper (17) to the corresponding wire guiding means (6).

9. Apparatus according to claim 1 further including a color camera (23) for observing a separated wire wherein the processing unit (21) determines the color code of the observed wire from the picture signal of the color camera and to retrieve the position of the corresponding contact (2) in the connector to be wired from a table, whereafter the processing unit is further adapted to control the shutter (14) of the wire selection means for delivering the wire, to control the gripper moving means (20) for feeding the delivered wire to the corresponding wire guiding means (6) and to control the tool moving means for aligning the tool with the corresponding contact.

10. Apparatus according to claim 1, wherein the processing unit (21) controls the gripper moving means (20) such that the gripper (17) holds a separated wire in a predetermined position in the observation field of the color camera.

11. Apparatus according to claim 1, wherein the processing unit (21) stores each of the already connected wires of a connector (1) to be wired in a memory, wherein in case the processing unit identifies a separated wire as a wire already connected, the processing unit starts a new identification of the separated wire at a new location of the wire.

12. Apparatus according to claim 1, wherein the processing unit (21) provides an alarm signal and stops the wiring of the connector if at a second identification a result is obtained contrary to the first identification or no useful result is obtained after a predetermined plurality of identifications.

13. Apparatus according to claim 1, including a bundle of wires (10) of a cable (8), is clamped in a wire bundle clamp (9), wherein the processing unit (21) controls the gripper moving means (20) for feeding the gripped wire to the wire guiding means (6) the gripper (17) follows a spherical shell path, the center of said gripper is located substantially in the wire bundle clamp.

* * * * *